US006973708B2

(12) United States Patent
Miura et al.

(10) Patent No.: US 6,973,708 B2
(45) Date of Patent: Dec. 13, 2005

(54) METHOD FOR REDUCING AC LOSS IN SUPERCONDUCTING COILS

(75) Inventors: Yushi Miura, Ibaraki (JP); Kaname Kizu, Ibaraki (JP); Katsuhiko Tsuchiya, Ibaraki (JP); Kunihiro Matsui, Ibaraki (JP); Toshinari Ando, Ibaraki (JP)

(73) Assignee: Japan Atomic Energy Research Institute, Tokyo (JP)

(*) Notice: Subject to any disclaimer, the term of this patent is extended or adjusted under 35 U.S.C. 154(b) by 538 days.

(21) Appl. No.: 10/301,565

(22) Filed: Nov. 22, 2002

(65) Prior Publication Data

US 2003/0184929 A1 Oct. 2, 2003

(30) Foreign Application Priority Data

Mar. 28, 2002 (JP) ............................ 2002-091210

(51) Int. Cl.[7] ............................................. H01L 39/24

(52) U.S. Cl. .................... 29/599; 174/125.1; 505/700; 505/704; 505/705

(58) Field of Search ...................... 29/599; 174/125.1; 505/700, 704, 705

(56) References Cited

U.S. PATENT DOCUMENTS

| | | | | |
|---|---|---|---|---|
| 5,531,015 A * | 7/1996 | Manlief et al. | ............... | 29/599 |
| 5,798,678 A * | 8/1998 | Manlief et al. | ............. | 335/216 |
| 6,603,379 B1 * | 8/2003 | Manlief et al. | ............. | 335/216 |

* cited by examiner

*Primary Examiner*—Carl J. Arbes
(74) *Attorney, Agent, or Firm*—Banner & Witcoff, Ltd.

(57) ABSTRACT

A method for reducing ac loss in a superconducting coil of cable-in-conduit type superconductor made from chrome-coated compound superconducting strands, characterized in that when a superconducting coil is produced by the wind-and-react technique, bending or twist strain is applied in an amount of 0.15~0.3% to the conductor cable portion after it has been heat-treated to form the superconducting compound, thereby separating the individual superconducting strands the chrome coat on which sintered as the result of heat treatment and further characterized in that the applied bending or twist strain is thereafter reverted to 0.1% or less, thereby reducing the ac loss of the superconducting coil.

2 Claims, 4 Drawing Sheets

METHOD FOR REDUCING AC LOSS IN SUPERCONDUCTING COILS

This application is based upon and claims the benefit of priority from Japanese Patent Application No. 91210/2002, filed Mar. 28, 2002, the entire contents of this application are incorporated herein by reference.

BACKGROUND OF THE INVENTION

This invention relates to a process for producing a coil of cable-in-conduit type superconductor with reduced ac loss from the induced current as produced between superconductor strands upon application of a time-varying magnetic field.

When the conventional coil of cable-in-conduit type superconductor is produced by the wind-and-react technique, it is necessary to ensure that superconductivity characteristics (e.g. critical current) will not deteriorate after heat treatment and to this end, the smallest possible strain is applied to the conductor (generally the strain is adjusted to within 0.1%).

FIG. 1 shows an exemplary structure of the cable-in-conduit type superconductor. The superconductor is basically composed of a conduit into which is inserted a cable that consists of superconductor strands (optionally together with copper wires).

When a time-varying magnetic field is applied to the superconductor, an induced current called coupling current flows between strands. Since the coupling current flows through the normal conducting portions (the stabilized copper portion and the plate on the superconductor strands), Joule's heat is generated to cause loss (ac loss). In order to reduce the ac loss, the resistance between strands may be increased so that the coupling loss decreases. The ac loss Qc is generally related to the inter-strand resistance ρ by the following expression:

$$Qc \propto 1/\rho \qquad (1)$$

and Qc can be reduced by increasing ρ.

On the other hand, in order to ensure that a current flows uniformly through a plurality of superconductor strands, they must have a certain degree of conductivity between themselves. To this end, a suitable value of inter-strand resistance is provided by plating the superconductor strands with chromium, nickel, etc. In particular, niobium, tin or niobium-aluminum strands that need heat treatment to form superconducting compounds frequently use chromium as a highly heat-resistant plate material. However, the chromium plate sinters during heat treatment of the conductor and this is considered to cause a marked decrease in inter-strand resistance.

It is generally known that the critical current characteristic of superconductor strands deteriorates if they are subjected to strain. In order to avoid this problem, superconducting coil manufacturers have been careful to ensure that the smallest possible strain is applied to the superconductor after heat treatment (the strain being typically adjusted to within 0.1%). As a consequence, most of the sintered plate on the superconducting strands remains intact and the inter-strand resistance drops to increase the ac loss of the superconductor.

SUMMARY OF THE INVENTION

According to the invention, there is provided a process for producing a superconducting coil, in which in order to separate off the sinter formed between chromized superconductor strands as the result of heat treatment, bending or twist strain is first applied to the heat-treated superconductor cable in an amount within a range of 0.15–0.3% that will not cause deterioration of the superconductivity characteristics and thereafter the amount of strain is reverted to 0.1% or less.

DETAILED DESCRIPTION OF THE INVENTION

Figure 1:
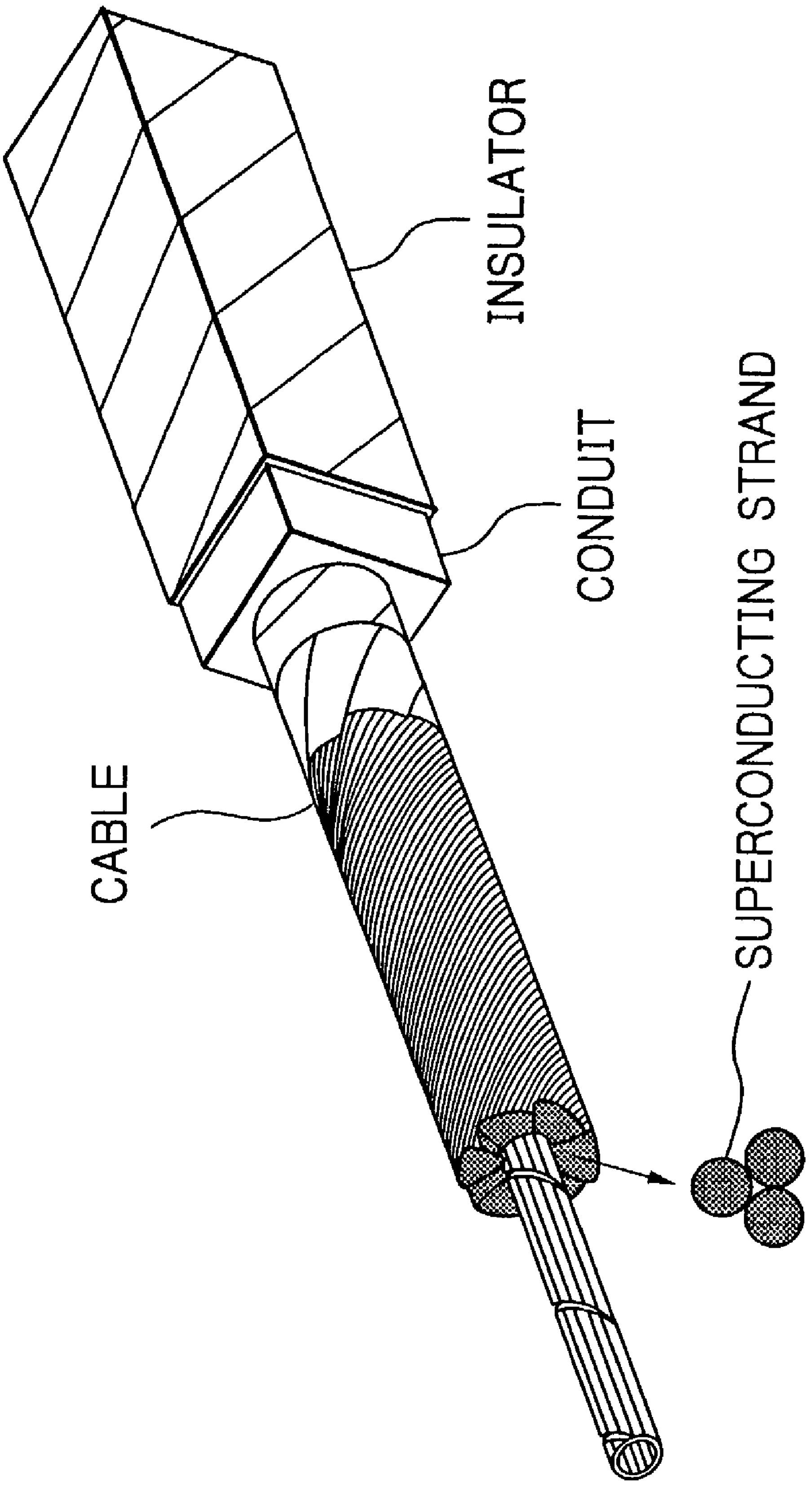
FIG. 1 shows an exemplary structure of a cable-in-conduit type superconductor.
Figure 2:
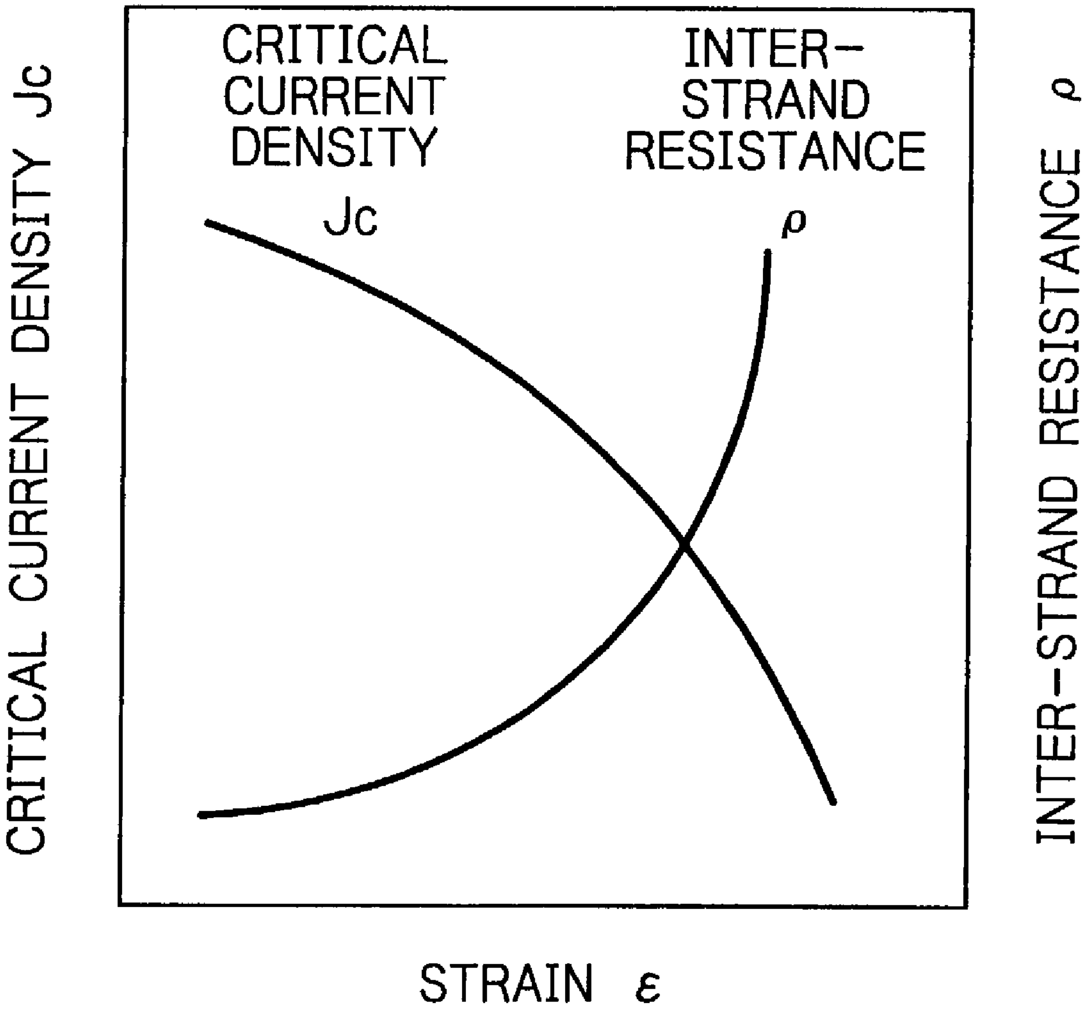
FIG. 2 is a graph showing the relationship between an applied strain and each of the critical current density of superconductor strands and their inter-strand resistance.

FIG. 2 is a graph showing the relationship between applied strain and each of the critical current density of superconducting strands and their ac loss as expressed by inter-strand resistance. The greater the strain that is applied, the more effectively separated off is the sinter between superconducting strands and, hence, the greater the reduction that is achieved in ac loss. On the other hand, the critical current characteristic of the superconducting strand deteriorates if it is placed under strain. The critical current characteristic is recovered if the applied strain is reverted to a smaller value but this is not the case if a strain in excess of a certain level is applied and the critical current characteristic remains deteriorated.

It is therefore clear from FIG. 2 that there is a certain appropriate level at which strain is to be applied to superconducting strands. Considering this, in the present invention, a strain in the range of 0.15~0.3% is first applied to superconducting strands and the applied strain is then reverted to 0.1% or less.

In coil production by the wind-and-react technique, the superconductor is usually heat-treated in coiled form. According to the invention, a superconductor coil is fabricated by first applying 0.15~0.3% of strain to a heat-treated superconductor and then reverting the applied strain to 0.1% or less.

The wind-and-react technique is a process for producing a superconducting magnet; if the magnet is to be produced from a $Nb_3Sn$ superconductor strand, the latter is wound into a coil without causing Nb to react with Sn; then, the coil is heat-treated to initiate reaction between Nb and Sn.

Figure 3:
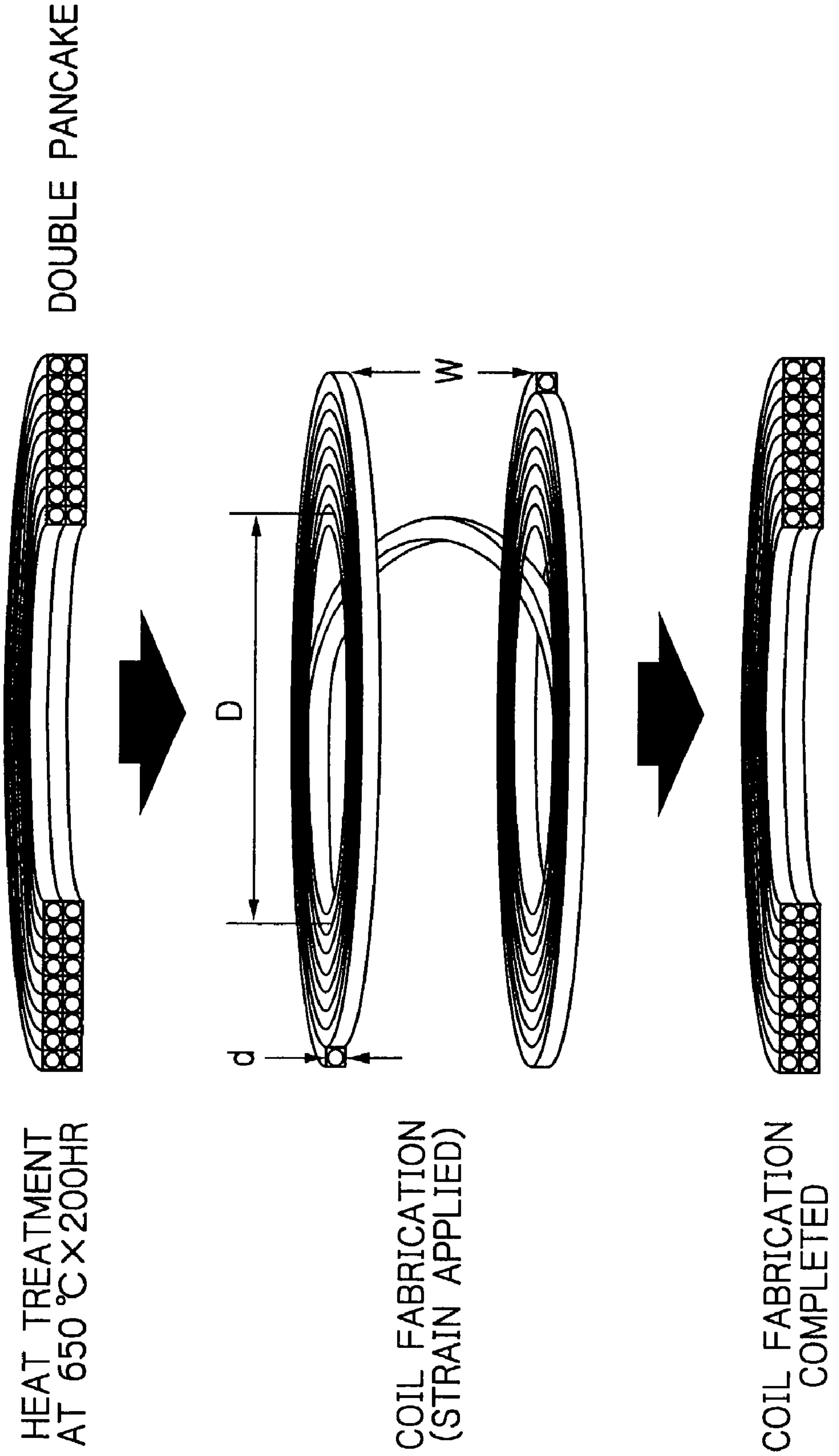
FIG. 3 illustrates an exemplary method of applying strain to a coil of a double pancake structure.

An example of the wind-and-react technique is shown in FIG. 3 and a cable-in-conduit superconductor is coiled into a double pancake configuration. The double pancake is then heat-treated at about 650° C. for about 240 hours in case of a $Nb_3Sn$ superconductor. After the heat treatment, the upper pancake is separated from the lower pancake by a distance of W so that 0.15~0.30% strain is applied to the superconducting strands of the two pancakes. After the application of the strain, the two coils are put together and brought back to the initial double pancake configuration, whereupon the applied strain is reverted to 0.1% or less.

Figure 4:
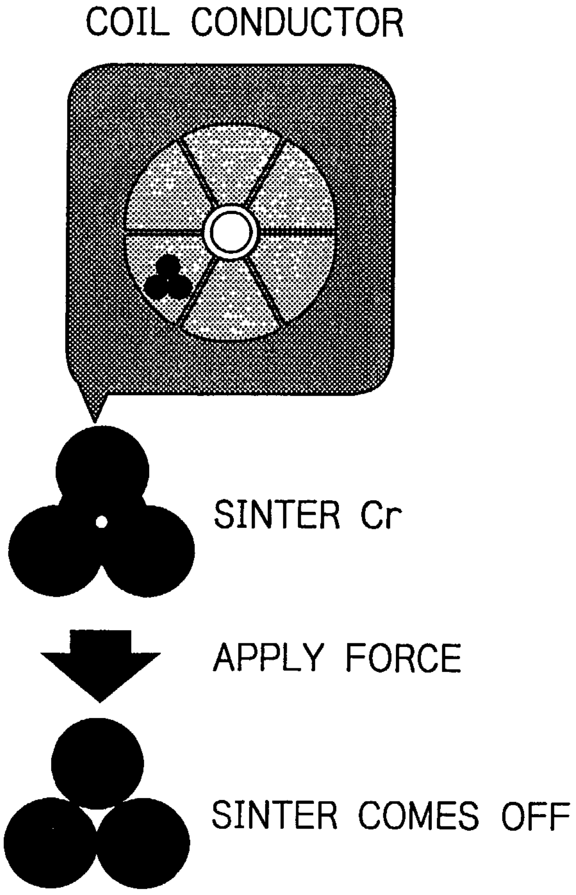
FIG. 4 shows how sinter comes off from between superconductor strands upon application of strain.

As shown in FIG. 4, the outer surfaces of the superconducting strands are plated with chromium or other conductor and, upon subsequent heat treatment, the plate is sintered and remains in the gap between adjacent superconducting strands. If the sinter comes off as the result of strain application (see FIG. 4), the coupling current (induced current) flowing between adjacent superconducting strands and, hence, the resulting ac loss, can be reduced. The critical current characteristic of the superconducting strands can be recovered by reverting the applied strain to 0.1% or less.

The following examples are provided for further illustrating the present invention but are in no way to be taken as limiting.

EXAMPLE 1

An example of the invention is described below with reference to FIG. 3. In the example, strain is applied to stranded superconductor strands with an outside diameter of d in a double pancake configuration with an inside diameter of D after they are heat-treated by the wind-and-react technique. More specifically, strain $\epsilon_t$ expressed by $$\epsilon_t = Wd/\pi D^2 \quad (2)$$

is applied to the superconducting strands by separating the two pancakes by a distance of W. The pancakes are then put together and brought back to the initial coil form of a double pancake configuration.

Superconducting coils can also be fabricated by the solenoid winding method (i.e., a narrow ribbon of superconductor is uniformly wound in a large number of turns around the same axis to make a coil) and one will readily understand that strain can be applied to the superconductor strands by separating them apart.

EXAMPLE 2

A chromized $Nb_3Sn$ conductor of cable-in-conduit type was subjected to an experiment for applying 0.1~0.3% strain after heat treatment. The result is shown in FIG. 5; the coupling time constant $n\tau$ on the vertical axis is proportional to and, hence, an index for the magnitude of ac loss Qc as follows:

$$Qc \propto n\tau \quad (3)$$

$$n\tau \propto 1/\rho \ (\rho \text{ is inter-strand resistance}) \quad (4)$$

Figure 5:
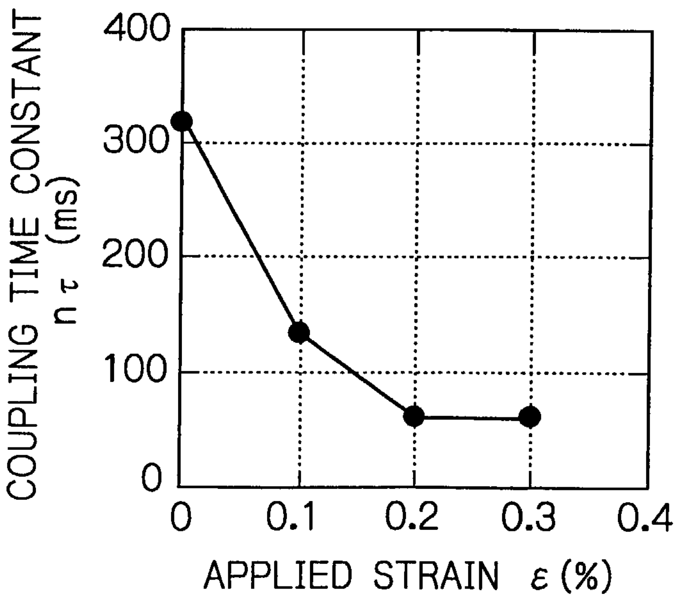
FIG. 5 is a graph showing how ac loss decreases as strain is applied to a heat-treated $Nb_3Sn$ superconductor with chromium plate.

FIG. 5 is a graph showing how ac loss decreases as strain is applied to the heat-treated $Nb_3Sn$ superconductor with chromium plate. Obviously, satisfactory reduction in ac loss can be accomplished by applying strain in an amount of 0.15~0.3%.

In accordance with the invention, strain is applied to heat-treated superconducting strands, whereupon the wires with a chromium plate that has sintered as the result of heat treatment are separated from each other, so that the inter-strand resistance is increased to reduce the coupling current and, hence, the ac loss.

Thus, the invention provides two unique advantages; first, the inter-strand coupling loss of chromized superconducting strands is reduced by applying 0.15~0.3% bending or twist strain to the wires; second, by applying bending or twist strain to the heat-treated superconducting strands in the process of fabricating a superconducting coil, the inter-strand coupling loss of the wires can be reduced from the very beginning of current impression.

What is claimed is:

1. A method for reducing ac loss in a superconducting coil of cable-in-conduit type superconductor made from chrome-coated compound superconducting strands, characterized in that when a superconducting coil is produced by the wind-and-react technique, bending or twist strain is applied in an amount of 0.15~0.3% to the conductor cable portion after it has been heat-treated to form the superconducting compound, thereby separating the individual superconducting strands the chrome coat on which sintered as the result of heat treatment and further characterized in that the applied bending or twist strain is thereafter reverted to 0.1% or less, thereby recovering the critical current characteristic of the wires.

2. The method according to claim 1, wherein twist strain is applied to a superconducting coil fabricated in a double pancake configuration and which has been heat-treated to form the superconducting compound.

* * * * *